US006919505B2

United States Patent
Cox

(10) Patent No.: US 6,919,505 B2
(45) Date of Patent: Jul. 19, 2005

(54) ELECTRONIC APPARATUS AND ENCLOSURE EMPLOYING SUBSTANTIALLY CO-PLANAR PORTIONS WITH MATING CRENELLATIONS

(75) Inventor: Roger W. Cox, Oakdale, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/727,921

(22) Filed: Dec. 4, 2003

(65) Prior Publication Data

US 2005/0121216 A1 Jun. 9, 2005

(51) Int. Cl.[7] ............................................... H05K 9/00
(52) U.S. Cl. .................. 174/35 C; 174/35 R; 361/816; 361/686
(58) Field of Search .......................... 174/35 R, 35 GC, 174/35 MS, 35 C; 361/816, 818, 686

(56) References Cited

U.S. PATENT DOCUMENTS

| | | | |
|---|---|---|---|
| 4,857,668 A | 8/1989 | Buonanno | |
| 5,105,056 A | 4/1992 | Hoge, Jr. et al. | |
| 5,142,101 A | 8/1992 | Matsuzaki et al. | |
| 5,202,536 A | 4/1993 | Buonanno | |
| 5,259,792 A | 11/1993 | Beck et al. | |
| 5,661,658 A | 8/1997 | Putt et al. | |
| 5,706,204 A | 1/1998 | Cox et al. | |
| 5,754,440 A | 5/1998 | Cox et al. | |
| 5,890,097 A | 3/1999 | Cox | |
| 5,913,698 A | 6/1999 | Keng | |
| 6,348,654 B1 * | 2/2002 | Zhang et al. | 174/35 GC |
| 6,521,828 B2 | 2/2003 | Ariel | |
| 6,613,977 B1 * | 9/2003 | Fowler | 174/35 GC |
| 2003/0161108 A1 | 8/2003 | Bright et al. | |

OTHER PUBLICATIONS

Leader Tech, a Heico Company, "CBS Circuit Board Shielding Design Guide", Oct. 2003, 14 pp.
W.L. Gore & Associates, Inc., "Basic EMI Principles and Glossary", http://www.goreelectronics.com/products/emi/Principles_Glossary.html, Oct. 28, 2003, 10 pp.
W.L. Gore & Associates, Inc., "Designers Face Growing EMI Shielding Problems", http://www.goreelectronics.com/products/emi/Shielding_Problem.html, Oct. 28, 2003, 3 pp.
W.L. Gore & Associates, Inc., "Remove the Mystique of EMI Suppression in High Volume Wire Applications", http://www.goreelectronics.com/tech_info/Remove_Mystique_Emi_Suppression_Volum . . . , Oct. 28, 2003, 4 pp.
Cutler–Hammer, "Metering Devices, Protective Relays & Communications Metering Devices", Jan. 2001, 2 pp.

* cited by examiner

Primary Examiner—Hung V. Ngo
(74) Attorney, Agent, or Firm—Martin J. Muran

(57) ABSTRACT

An electronic apparatus, such as a meter, includes an enclosure having a first housing portion with an opening and a second front plate portion. Meter circuitry is mounted within the enclosure. The second front plate portion mates with the first housing portion within the opening and forms an interface joint. The housing and front plate portions are at least substantially co-planar proximate the interface joint and include a plurality of mating crenellations. These mating crenellation, such as serrations, reduce electromagnetic interference radiation to or from the enclosure when the housing and front plate portions are mated together.

2 Claims, 3 Drawing Sheets

ELECTRONIC APPARATUS AND ENCLOSURE EMPLOYING SUBSTANTIALLY CO-PLANAR PORTIONS WITH MATING CRENELLATIONS

BACKGROUND OF THE INVENTION

1. Field of the Invention

The invention relates to enclosures for electronic apparatus and, more particularly, to such enclosures that reduce electromagnetic interference emissions to and/or from the enclosures. The invention also relates to electronic apparatus employing enclosures that reduce electromagnetic interference emissions thereto and/or therefrom.

2. Background Information

The operation of electronic apparatus (e.g., without limitation, electronic equipment; electronic devices; televisions; radios; computers; medical and other electronic instruments; business machines; communications devices; control and/or monitoring devices) is attended by the generation of electromagnetic radiation within the electronic circuitry of the apparatus. Such radiation often develops as a field or as transients within the radio frequency band of the electromagnetic spectrum (e.g., between about 10 KHz and 10 GHz), and is termed "electromagnetic interference" (EMI), which is known to interfere with the operation of other proximate electronic devices. See, for example, U.S. Pat. Nos. 5,202,536; 5,142,101; 5,105,056; and 4,857,668.

Digital and/or processor-based electronic devices produce electromagnetic fields at harmonics of the clock frequency and also at frequencies related to the rise and fall times of logic signals. The most straightforward controls for EMI involve the use of multi-layer printed circuit boards and ground planes. Nevertheless, emissions can easily exceed regulatory requirements.

The last line of defense is the electronic enclosure. To reduce electromagnetic emissions, the typical electronic enclosure is made of conductive materials, such as aluminum or steel. Even then, any openings or seams may act as slot antennas. These slots pass EMI at frequencies having wavelengths less than eight times the size of the slot. To attenuate EMI effects, shielding having the capability of absorbing and/or reflecting EMI energy may be employed both to confine the EMI energy within a source device, and to insulate that device or other "target" devices from other source devices. Such shielding is provided as a barrier, which is inserted between the source and the other devices, and typically is configured as an electrically conductive and grounded housing to enclose the device.

As the circuitry of the electronic device generally must remain accessible for servicing or the like, most housings are provided with openable or removable accesses, such as doors, hatches, panels or covers. Between even the flattest of these accesses and its corresponding mating or faying surface, however, there may be present gaps, which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna In this regard, bulk or surface currents induced within the housing develop voltage gradients across any interface gaps in the shielding, which gaps thereby function as antennas and radiate EMI noise. In general, the amplitude of the noise is proportional to the gap length, with the width of the gap having a relatively smaller effect.

To address EMI, EMI shielding products attempt to prevent undesired electromagnetic energy and radio frequency interference (RFI) from disrupting, or radiating from, electronic devices. Such products include, for example, wire mesh O-rings; fabric-over-foam profile gaskets; shielding tapes; fabric-over-foam I/O gaskets; cable shielding; EMI shielding glass; shielding laminates; selectively coated, custom formable shields; beryllium copper spring-finger gasketing; and silver coated nylon gasketing. Nevertheless, such products are expensive.

One example of an electronic device is the personal computer (PC). In order to attenuate electromagnetic signals, the typical PC case includes steel plates and shields; nevertheless, there are emissions through the seams and through openings created for add-on cards. In some applications, electromagnetic gasket material attempts to attenuate non-complaint signals at the seams and the openings. The more overlap provided by the gasket material at a seam or opening, the better the attenuation. However, the cost of the gasket material and related assembly is relatively expensive.

In a microwave oven, for example, the wavelengths of signals are relatively very short. Hence, such microwave ovens employ electromagnetic gaskets for relatively long seams and an array of relatively small holes in a conductive panel for the window.

For filling gaps within mating surfaces of housings and other EMI shielding structures, gaskets and other seals have been proposed for maintaining electrical continuity across the structure. Such seals are bonded or mechanically attached to, or press-fit into, one of the mating surfaces, and close any interface gaps, in order to establish a continuous electrically conductive path thereacross by conforming under an applied pressure to irregularities between the surfaces.

EMI shielding gaskets, for example, are used in electronic equipment to provide protection against interference from electromagnetic energy, including RFI and more broadly all bands of EMI. The shielding has an electrically conductive element, be it a wire mesh, conductive filler or conductive plating, coating or fabric, which prevents external EMI from interfering with an electronic device and/or protects other adjacent electronic devices from EMI emitted by an electronic device.

The Background of the Invention section of U.S. Pat. No. 6,521,828 discloses a form-in-place FIP) process for the manufacture of EMI shielding gaskets. One method of achieving a lower closure force gasket design has been to form the gasket as having a periodic "interrupted" pattern of alternating local maxima and minima heights. Gaskets of such type may be formed by molding or the FIP process as having a crenellated, i.e., notched, serrated or a sinusoidal "waveform" profile, or as a series of discrete beads. In general, for a specified joint configuration, a gasket having such an "interrupted" profile or pattern would be expected to exhibit a greater deflection under a given compressive load than a continuous profile.

U.S. Pat. No. 5,259,792 discloses an electrical connector housing for a flat ribbon-type electrical transmission cable and method for minimizing EMI emissions. The connector housing has a top half and a bottom half, which are fitted together with an interlock joint, in order to minimize the emission of EMI through the joint. The interlock is provided by a number of interrupt elements that provide discontinuity along the otherwise continuous line joint to minimize the emissions of interference signals. Preferably, the interlock along the interface between the top and bottom connector housing halves is provided by serrations in the form of triangular teeth that fit together. The teeth interlock, in order that there is insufficient space to allow for the transmission of EMI at frequencies at least up to six gigahertz. However, the interrupt may be provided in the form of other elements as long as there is no space having a linear dimension greater than ⅛ of the EMI wavelength. The plastic housing halves are plated with a metal plating shield, such as a copper-nickel alloy, to provide shielding. Also, RFI shielding strips are affixed to each housing half, in order that when the housing halves are clamped together the shielding strips will make positive electrical contact with a cable foil metal shield.

Military contractors have used many techniques to attenuate and deflect radar signals. For example, the goal of stealth technology is to make an aircraft invisible to radar. The stealth aircraft is shaped, in order that any incident radar signals are reflected away from the radar source and/or the aircraft is covered in materials that absorb radar signals. For example, the stealth aircraft may be made up of completely flat surfaces and relatively very sharp edges. When a radar signal hits a stealth aircraft, the signal reflects away at an angle. In contrast, most conventional aircraft have a rounded shape, which creates a very efficient radar reflector, thereby reflecting some of the signal back to the source.

There is room for improvement in electronic apparatus and enclosures therefor.

SUMMARY OF THE INVENTION

These needs and others are met by the present invention, which employs first and second enclosure portions to form an interface joint. The first and second enclosure portions are at least substantially co-planar proximate the interface joint and include a plurality of mating crenellations. This limits the size of enclosure slots at the interface joint in any particular direction.

As one aspect of the invention, an electronic apparatus comprises: an enclosure including a first enclosure portion and a second enclosure portion; and electronic circuitry within the enclosure, the second enclosure portion mating with the first enclosure portion and forming an interface joint, the first and second enclosure portions being at least substantially co-planar proximate the interface joint and including a plurality of mating crenellations, in order to reduce electromagnetic interference radiation to or from the enclosure when the first and second enclosure portions are mated together.

The mating crenellations may be a series of mating serrations extending along the interface joint. The first and second enclosure portions may include co-planar mating portions, which form the interface joint. The mating crenellations may be a series of mating serrated teeth extending along the interface joint.

The first enclosure portion may be a housing including an opening and an edge with a first set of the mating crenellations defining the opening. The second enclosure portion may be a plate having a periphery with a second set of the mating crenellations within the opening. The first and second sets of the mating crenellations may mate and define the interface joint.

As another aspect of the invention, an electronic apparatus enclosure comprises: a first enclosure portion adapted to house electronic circuitry therein; and a second enclosure portion mating with the first enclosure portion and forming an interface joint, the first and second enclosure portions being at least substantially coplanar proximate the interface joint and including a plurality of mating crenellations, in order to reduce electromagnetic interference radiation to or from the enclosure when the first and second enclosure portions are mated together.

The first enclosure portion may be a housing including an opening and an edge with a first set of the mating crenellations at the opening. The second enclosure portion may be a plate having a periphery with a second set of the mating crenellations within the opening. The first and second sets of the mating crenellations may be co-planar and mate to define the interface joint.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
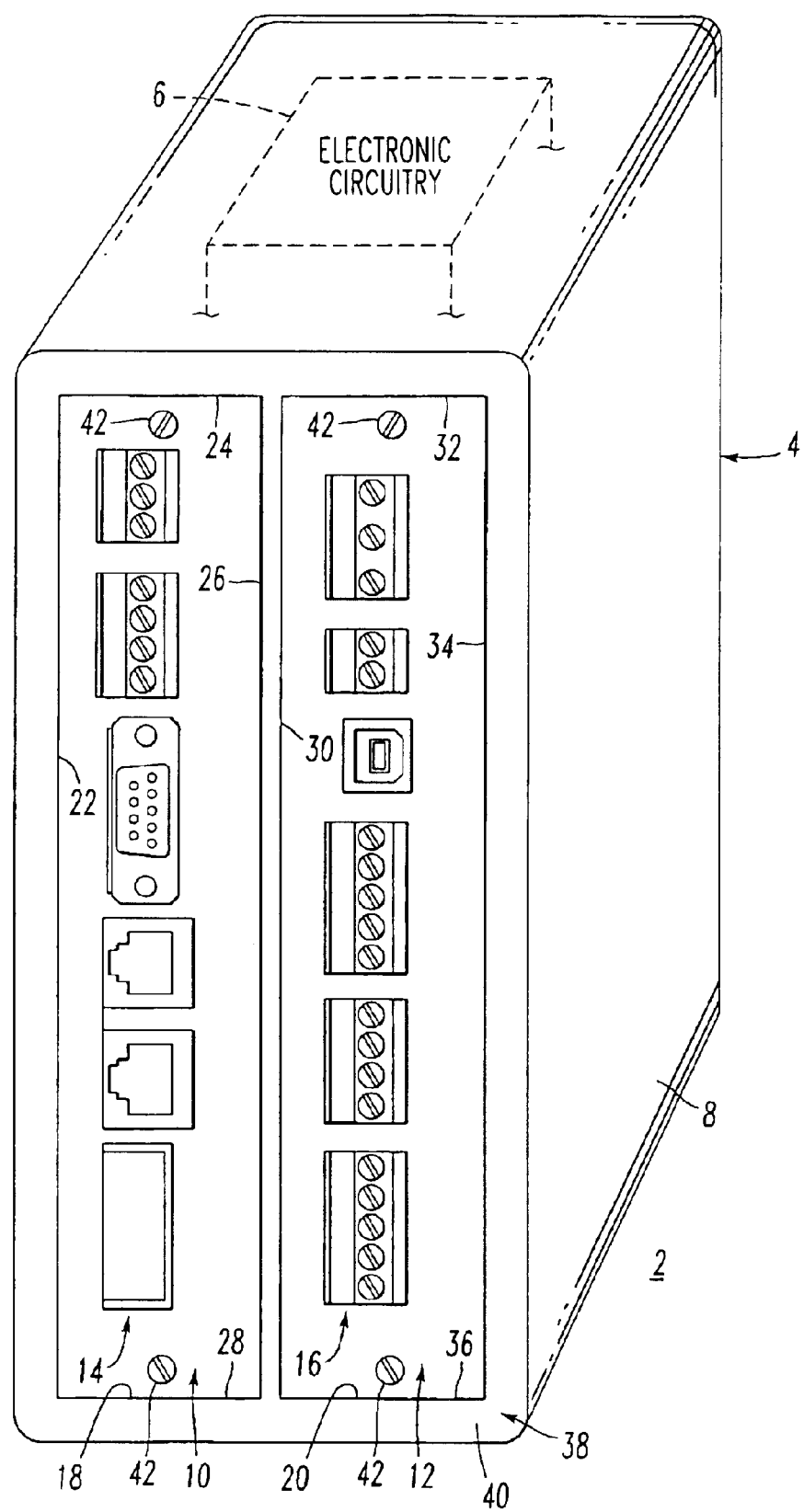
FIG. 1 is a simplified isometric view of an enclosure for electronic equipment.

FIG. 1 shows an electronic device 2 including a housing 4 and electronic circuitry 6 (shown in hidden line drawing) therein. The housing 4 includes a generally five-sided enclosure 8 and two front plates 10,12 having a plurality of connectors 14,16, respectively. The front plates 10,12 mate with the enclosure 8 at two openings 18,20, respectively, thereof. The front plates 10,12 and respective openings 18,20 form eight slotted joints 22,24,26,28,30,32,34,36. The front surface 38 of the housing 4, including the front plates 10,12 and the front surface 40 of the enclosure 8 is generally planar. The front plates 10,12 are secured to the enclosure 8 by suitable fasteners 42.

Figure 2:
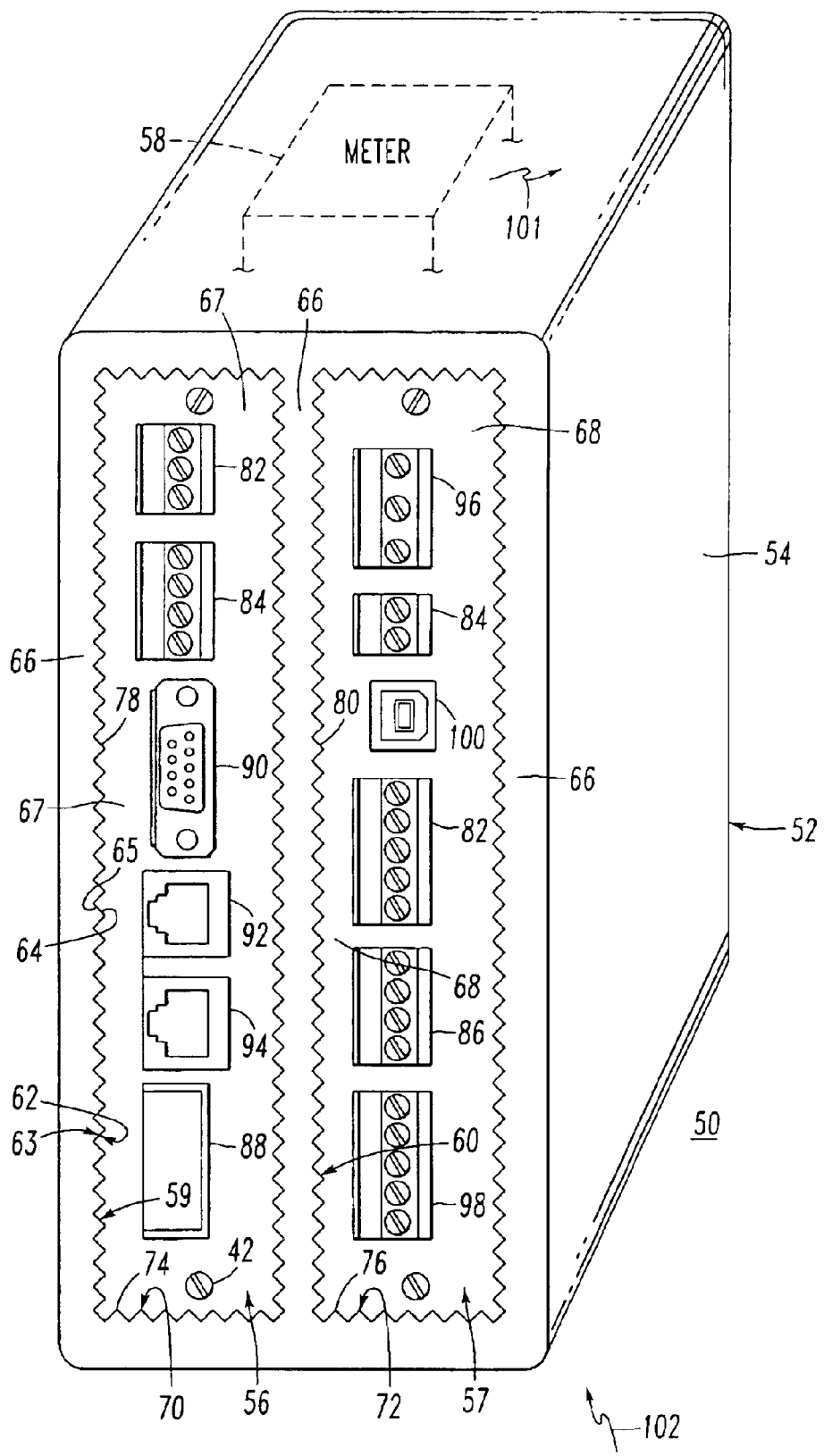
FIG. 2 is an isometric view of an enclosure for a meter in accordance with an embodiment of the present invention.

Referring to FIG. 2, an electronic apparatus 50 includes an enclosure 52 having a first enclosure portion 54 and two second enclosure portions 56,57, and electronic circuitry 58 (e.g., meter circuitry) (shown in hidden line drawing) within the enclosure 52. The second enclosure portions 56,57 mate with the first enclosure portion 54 and form two interface joints 59,60, respectively. The first and second enclosure portions 54,56,57 are at least substantially co-planar proximate the interface joints 59,60 and include a plurality of mating crenellations 62,63 (as shown with the portion 56), in order to reduce electromagnetic interference radiation to or from the enclosure 52 when the first and second enclosure portions 54,56,57 are mated together. The mating crenellations 62,63 are a series of mating serrations 64,65 (e.g., mating serrated teeth) extending along the interface joints 59,60. The first and second enclosure portions 54,56,57 include co-planar mating portions 66,67,68, which form the interface joints 59,60.

As shown in FIG. 2, rather than the relatively long slotted openings 18,20 of FIG. 1, the interface joints 59,60 employ a series of the mating serrations 64,65. In this manner, only EMI at frequencies having wavelengths less than eight times the size of each of the mating serrations 64,65 can pass therethrough without being filtered.

Examples of the meter circuitry 58 are disclosed, for example, in U.S. Pat. Nos. 5,890,097; 5,754,440; 5,706,204; and 5,661,658, which are incorporated herein by reference. Although example meter circuitry 58 is disclosed, the invention is applicable to any suitable electronic circuitry within the enclosure 52.

In this example, the first enclosure portion 54 is a generally five-sided housing including two openings 70,72 having edges 74,76 with the mating crenellations 62. The second enclosure portions 56,57 are front plates having peripheries 78,80 with the mating crenellations 63 within the openings 70,72. The mating crenellations 62,63 of the co-planar mating portions 66,67,68 are co-planar and mate to define the interface joints 59,60.

Although two openings 70,72, two front plates 56,57 and two interface joints 59,60 are shown, the invention is applicable to enclosures including a single interface joint having one or more longitudinal edges with mating crenellations. Although front plates 56,57 are shown, the invention is applicable to one or more interface joints disposed on any side(s) of an enclosure.

One or more connectors are operatively associated with the meter circuitry 58 on one or both of the front plates 56,57. For example, the meter circuitry 58 may include one or more printed circuit boards (not shown) electrically and mechanically interfacing the connectors. Examples of such connectors include an input connector 82, an output connector 84, an input/output connector 86, an RS-485 connector 88, a serial port connector 90, an Ethernet connector 92, a telephone connector 94, a power supply connector 96, a terminal block 98 and a USB port connector 100.

Any inputs and/or outputs (e.g., connections 82,84,86,88, 90,92,94,96,98,100), if employed, preferably include shielded cables and shielded connectors, especially if the corresponding inputs and/or outputs do not have a suitably high impedance.

The electromagnetic interference radiation 101 internal to the enclosure 52 and the electromagnetic interference radiation 102 external to the enclosure 52 have frequencies and corresponding wavelengths. The mating crenellations 62,63 define miniature slots along the interface joints 59,60. The length of those slots is less than a predetermined fraction (e.g., 1/8) of the wavelength. For example, from the well known equation $\lambda=c/f$, wherein $\lambda$ is wavelength, c is the speed of light ($=3.0\times10^8$ m/s$\times$39.37 in./m) in a vacuum and f is frequency, if the slot length is desired to be less than 1/8 of the wavelength of a selected frequency, such as 6 GHz, then the maximum slot length (i.e., the maximum length of any of the individual serrated edges of the interface joints 59,60) would be about 0.25 in. If the length of the slots is 1/8 of a selected wavelength (e.g., $\lambda$), then relatively smaller wavelengths (i.e., <$\lambda$) are not filtered, wavelengths (i.e., >2$\lambda$) greater than twice the selected wavelength are filtered, and intermediate wavelengths (i.e., between $\lambda$ and 2$\lambda$) are somewhat filtered.

Although serrated edges of the interface joints 59,60 are shown in FIG. 2, a wide range of other suitable crenellated edges may be employed. For example, the interface joints may employ notches (FIG. 3) or embrasures (FIG. 4). Such crenellated edges may be formed by any suitable process, such as, for example, stamping or routing.

Figure 3:
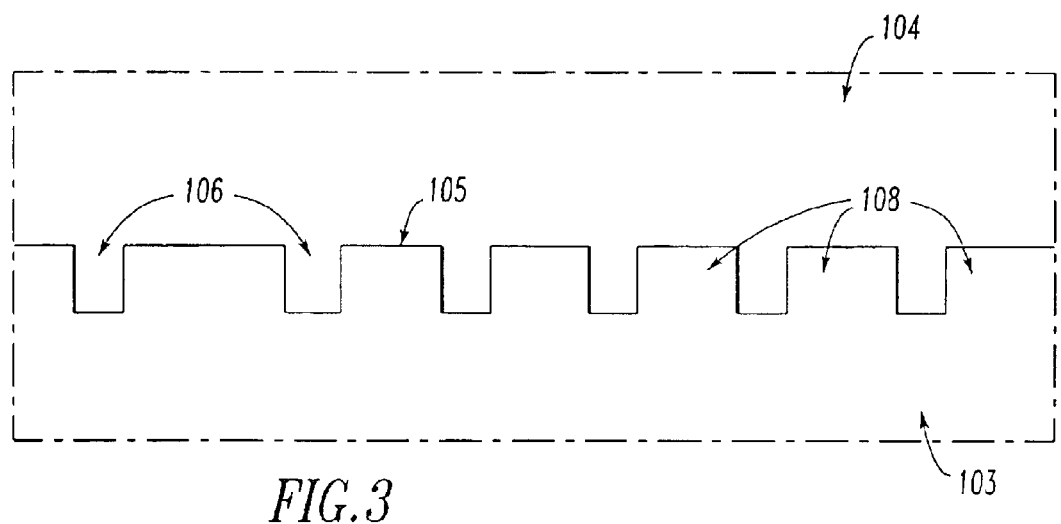
FIG. 3 is a plan view of two mating enclosure portions employing crenellations as an interface joint in accordance with another embodiment of the invention.
Figure 4:
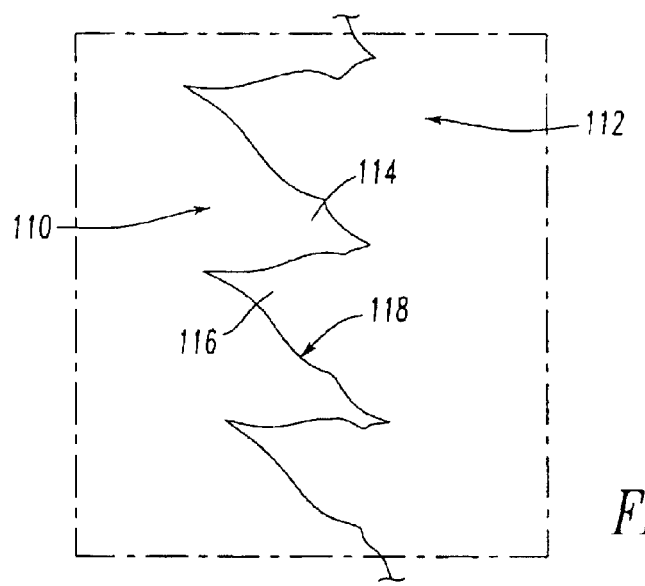
FIG. 4 is a plan view of two mating enclosure portions employing embrasures as an interface joint in accordance with another embodiment of the invention.

As shown in FIG. 3, two mating enclosure portions 103,104 form, in the manner of a battlement, an interface joint 105 including alternating openings, such as notched recesses or embrasures 106, and raised sections, such as notched projections or merlons 108, extending along that interface joint. These mating crenellations form an irregular square wave pattern. Although a somewhat irregular pattern of embrasures 106 and merlons 108 is shown, such a pattern may be irregular or regular (e.g., a notched or square wave pattern having, for example, a 50% or other suitable duty cycle). Here, the mating enclosure portions 103,104 are preferably coplanar.

Referring to FIG. 4, two mating enclosure portions 110, 112 employ mating embrasures 114,116 to define an interface joint 118.

The electronic equipment enclosure 52 of FIG. 2 employs an improved structure, which replaces a conventional slotted opening with an interface joint, such as 59 or 60, having a plurality of mating crenellations 62,63, in order to reduce emissions of interference radiation 101,102 to or from the enclosure 52. These mating crenellations 62,63 directly limit the size of the enclosure slots in any particular direction. The disclosed mating crenellations 62,63, 106,108, 114,116 and 124,126 minimize emissions of electromagnetic interference radiation to or from an enclosure, such as 52.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An electronic apparatus comprising:

an enclosure including a first enclosure portion and a second enclosure portion;

electronic circuitry within said enclosure;

said second enclosure portion mating with said first enclosure portion and forming an interface joint, said first and second enclosure portions being at least substantially co-planar proximate said interface joint and including a plurality of mating crenellations, in order to reduce electromagnetic interference radiation to or from said enclosure when said first and second enclosure portions are mated together;

wherein said first enclosure portion is a housing including an opening and an edge with a first set of said mating crenellations defining the opening; wherein said second enclosure portion is a plate having a periphery with a second set of said mating crenellations within said opening; and wherein said first and second sets of said mating crenellations mate and define said interface joint; and wherein at least one connector operatively associated with said electronic circuitry is disposed on said plate.

2. The electronic apparatus of claim 1 wherein said at least one connector is selected from the group comprising an input connector, an output connector, an input/output connector, an RS-485 connector, a serial port connector, an Ethernet connector, a telephone connector, a power supply connector, a terminal block and a USB connector.

* * * * *